United States Patent
Rouh et al.

(10) Patent No.: US 7,728,312 B2
(45) Date of Patent: Jun. 1, 2010

(54) APPARATUS AND METHOD FOR PARTIAL ION IMPLANTATION

(75) Inventors: Kyong Bong Rouh, Goyang-si (KR); Dong Seok Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 125 days.

(21) Appl. No.: 11/957,914

(22) Filed: Dec. 17, 2007

(65) Prior Publication Data

US 2009/0001291 A1    Jan. 1, 2009

(30) Foreign Application Priority Data

Jun. 29, 2007    (KR) ...................... 10-2007-0065832

(51) Int. Cl.
*H01J 37/317* (2006.01)
*H01J 37/08* (2006.01)
*G21K 5/10* (2006.01)

(52) U.S. Cl. .............................. 250/492.21; 250/492.2; 250/492.3; 250/492.1; 250/423 R; 250/396 R; 315/111.81; 315/111.61

(58) Field of Classification Search ............ 250/492.21, 250/492.2, 492.3, 492.1, 423 R, 396 R; 315/111.81, 315/111.61
See application file for complete search history.

(56) References Cited

U.S. PATENT DOCUMENTS

| | | | |
|---|---|---|---|
| 4,766,320 A | | 8/1988 | Naitoh et al. ............. 250/492.2 |
| 6,326,631 B1 * | | 12/2001 | Politiek et al. ......... 250/492.21 |
| 6,423,976 B1 * | | 7/2002 | Glavish et al. ......... 250/492.21 |
| 6,946,667 B2 * | | 9/2005 | Chen et al. ............. 250/492.21 |
| 6,998,625 B1 | | 2/2006 | McKenna et al. |
| 7,064,491 B2 | | 6/2006 | Horsky et al. .......... 315/111.81 |
| 7,361,913 B2 * | | 4/2008 | Low et al. ............. 250/492.21 |
| 2008/0149845 A1 * | | 6/2008 | Benveniste et al. .... 250/396 ML |

FOREIGN PATENT DOCUMENTS

| | | |
|---|---|---|
| JP | 2002-525820 | 8/2002 |
| KR | 10-2006-0064571 | 6/2006 |
| KR | 10-2006-0115413 | 11/2006 |
| KR | 10-0732770 | 6/2007 |

* cited by examiner

*Primary Examiner*—Nikita Wells
(74) *Attorney, Agent, or Firm*—Marshall, Gerstein & Borun LLP

(57) ABSTRACT

An apparatus and method for partial ion implantation, which desirably provide control over the energy of the implanted dopants, generally includes an ion beam generator, and first and second deceleration units. The first deceleration unit decelerates the energy of an ion beam generated by the ion beam generator; and a subsequent, second deceleration unit further decelerates the energy into different energy levels according to regions of a wafer into which the ions are to be implanted.

10 Claims, 6 Drawing Sheets

APPARATUS AND METHOD FOR PARTIAL ION IMPLANTATION

CROSS-REFERENCE TO RELATED APPLICATION

The priority of Korean patent application No. 10-2007-0065832 filed on Jun. 29, 2007, the disclosure of which is incorporated by reference in its entirety, is claimed.

BACKGROUND OF THE INVENTION

1. Field of the Disclosure

The disclosure relates generally to an apparatus and method for ion implantation, and more particularly to an apparatus and method for partial ion implantation.

2. Brief Description of Related Technology

Many unit processes are formed to fabricate a semiconductor memory, such as a dynamic random access memory (DRAM). These unit processes include a stacking process, an etching process, an ion implantation process, a photolithography process, etc., and are generally carried out in wafers. Ion implantation is a process in which dopant ions, such as boron or arsenic, are accelerated by a high electric field, and passed through the surface of a wafer. The electrical characteristics of a material can be changed by an ion implantation process.

Ion implantation into a wafer is usually performed at the same dose throughout the entire domain of the wafer. While this may be preferable in the ion implantation process, it also may adversely affect other unit processes. As a result of certain unit processes, the thicknesses or the etching degrees of stacked films are not uniform throughout the entire domain of the wafer because many parameters of the respective unit processes cannot be precisely controlled. Accordingly, there are unexpected tolerances or tolerances due to the parameters, which are not precisely controlled. For example, in the fabrication of a transistor, a junction region usually is formed having a lightly doped drain (LDD) structure for suppressing a short route effect. For this reason, a spacer film is formed on the side wall of a gate, and deep source/drain regions are formed by ion implantation using the spacer film and the gate as an ion implantation mask. However, during unit processes (a stacking process, a mask process, and an etching process) performed to form the spacer film, the length or thickness of the spacer film cannot be substantially uniform throughout the entire domain of the wafer. Further, ion implantation cannot be uniformly performed throughout the entire domain of the wafer. That is, there is a deviation of dopant doses between the center and the edge of the wafer. Due to this non-uniformity, many parameters including the threshold voltage of the transistor are different in the same wafer. This may cause serious problems in consideration of the present trend of the wafer towards the increase in size.

SUMMARY OF THE INVENTION

Disclosed herein are a method and apparatus for implanting ions into ion-implantable regions of a wafer by desirably controlling the energy of an implanted dopant. The apparatus generally includes an ion beam generator, and first and second declaration units capable of decelerating the energy of an ion beam. More specifically, the first deceleration unit is capable of initially decelerating the energy of an ion beam generated by the ion beam generator. The second deceleration unit is capable of decelerating the initially-decelerated energy of the ion beam into first and second energy levels according to the ion-implantable regions of the wafer into which the ions are to be implanted. The second deceleration unit preferably includes at least one electrode capable of having a voltage applied thereto. The apparatus preferably includes a wafer support adjustable to position a first region of the wafer to receive and have implanted therein the ion beam having the first energy, and adjustable to position a second region of the wafer to receive and have implanted therein the ion beam having the second energy. The wafer support preferably is adjustable to position the wafer in a direction that is substantially perpendicular to the implanted ion beams, rotatable, and/or variably tiltable.

According to one embodiment, an apparatus for partial ion implantation, which implants ions into a wafer at non-uniform energy, includes an ion beam generation unit for generating an ion beam; a first deceleration unit for firstly (initially) decelerating the energy of the ion beam generated from the ion beam generation unit; and a subsequent second deceleration unit for secondarily decelerating the energy, firstly decelerated by the first deceleration unit, into different first or second energy according to regions of the wafer, into which the ion beam is implanted. The second deceleration unit preferably includes at least one deceleration electrode. The deceleration of the energy into the first or second energy by the second deceleration unit may be achieved by applying voltages having different levels to the deceleration electrode. The second deceleration unit preferably decelerates the energy of the ion beam into the first energy in the case that the ion beam is implanted into a first region of the wafer, and decelerate the energy of the ion beam into the second energy in the case that the ion beam is implanted into a second region of the wafer.

The apparatus for partial ion implantation preferably includes a wafer support (or supporter) for supporting the wafer so as to allow the ion beam, passed through the second deceleration unit, to be implanted into the wafer, and moving the wafer such that the ion beam having the first energy is implanted into a first region of the wafer and the ion beam having the second energy is implanted into a second region of the wafer. In various preferred embodiments, the wafer supporter is capable of adjusting the position of the wafer in a direction that is substantially perpendicular to the implanted ion beam, rotating the wafer, and/or tilting the wafer such that the angle between the implanted ion beam and the surface of the wafer is varied.

The method generally includes providing a wafer having first and second ion-implantable regions, generating an ion beam, decelerating the energy of the ion beam to a first energy level, and then further decelerating the energy of the first energy level ion beam into a different first or second energy levels according to regions of the wafer. The method further includes implanting ions from the ion beam having the first energy level into the first wafer region and ions from the ion beam having the second energy level into the second wafer region. The method preferably includes moving the wafer such that ions from the ion beam having the first energy level are implanted into the first wafer region, and ions from the ion beam having the second energy level are implanted into the second wafer region.

According to one embodiment, a method for partial ion implantation, in which ions are implanted into a wafer at non-uniform energy, includes generating an ion beam; firstly (initially) decelerating the ion beam; and secondarily decelerating the firstly-decelerated ion beam into a different first or second energy according to regions of the wafer, such that the ion beam having the first energy is implanted into a first region of the wafer and the ion beam having the second energy is implanted into a second region of the wafer. According to another embodiment, the method can further include moving the wafer such that the ion beam having the first energy is implanted into a first region of the wafer and the ion beam having the second energy is implanted into a second region of the wafer.

Additional features of the invention may become apparent to those skilled in the art from a review of the following detailed description, taken in conjunction with the drawings, and the appended claims.

BRIEF DESCRIPTION OF THE DRAWINGS

For a more complete understanding of the disclosure, reference should be made to the following detailed description and accompanying drawings wherein.

Figure 1:
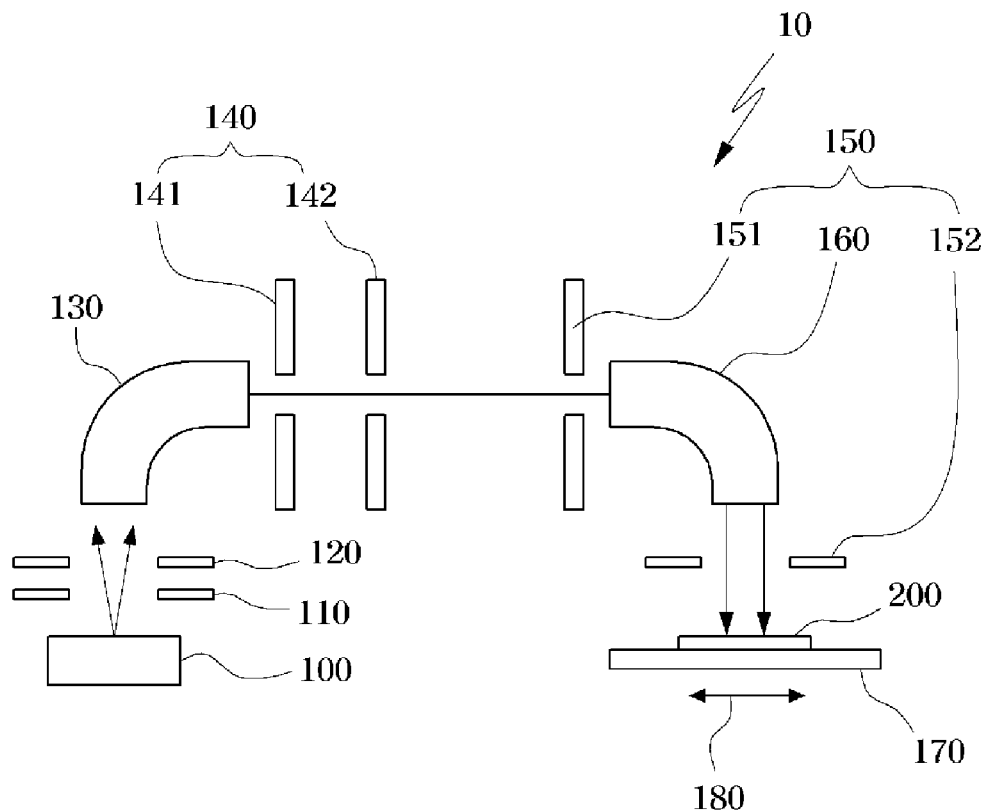
FIG. 1 is a schematic view of an apparatus for partial ion implantation in accordance with the claimed invention.

While the disclosed method and apparatus are susceptible of embodiments in various forms, there are illustrated in the drawings (and will hereafter be described) specific embodiments, with the understanding that the disclosure is intended to be illustrative, and is not intended to limit the method or apparatus to the specific embodiments described and illustrated herein.

DETAILED DESCRIPTION OF THE PREFERRED EMBODIMENTS

Disclosed herein are a method and apparatus for implanting ions into ion-implantable regions of a wafer by desirably controlling the energy of an implanted dopant. The apparatus generally includes an ion beam generator, and first and second declelaration units capable of decelerating the energy of an ion beam. More specifically, the first deceleration unit is capable of initially decelerating the energy of an ion beam generated by the ion beam generator. The second deceleration unit is capable of decelerating the initially-decelerated energy of the ion beam into first and second energy levels according to the ion-implantable regions of the wafer into which the ions are to be implanted. The second deceleration unit preferably includes at least one electrode capable of having a voltage applied thereto. The apparatus preferably includes a wafer support adjustable to position a first region of the wafer to receive and have implanted therein the ion beam having the first energy, and adjustable to position a second region of the wafer to receive and have implanted therein the ion beam having the second energy. The wafer support preferably is adjustable to position the wafer in a direction that is substantially perpendicular to the implanted ion beams, rotatable, and/or variably tiltable.

The method generally includes providing a wafer having first and second ion-implantable regions, generating an ion beam, decelerating the energy of the ion beam to a first energy level, and then further decelerating the energy of the first energy level ion beam into a different first or second energy levels according to regions of the wafer. The method further includes implanting ions from the ion beam having the first energy level into the first wafer region and ions from the ion beam having the second energy level into the second wafer region. The method preferably includes moving the wafer such that ions from the ion beam having the first energy level are implanted into the first wafer region and ions from the ion beam having the second energy level are implanted into the second wafer region.

The disclosed method and apparatus are described in more detail, below, with reference to the accompanying drawing figures, wherein like reference numbers refer to the identical or similar elements in the various figures. With reference to FIG. 1, the apparatus for partial ion implantation includes an ion beam generation unit, which generates an ion beam, a first deceleration unit, which firstly (initially) decelerates the energy of the ion beam generated from the ion beam generation unit, a second deceleration unit, which secondarily decelerates the energy of the ion beam, firstly decelerated, and an end station, which supports a wafer 200 so that the ion beam emitted from the second deceleration unit is implanted into the wafer 200.

The ion beam generation unit includes a source 100, a source suppressor 110, a source extractor 120, and a first analyzer 130. Ion gas generated from the source 110 is converted into ion particles through the source suppressor 110 and the source extractor 120. Thereafter, the ion particles enter the first analyzer 130, which selectively moves necessary ion particles out of the entered ion particles to a desired (or designated) route to generate an ion beam.

The first deceleration unit includes a first deceleration electrode 141 and a first deceleration suppressor 142. The first deceleration electrode 141 decelerates the energy of the ion beam supplied from the first analyzer 130 to an energy lower than the initial energy. The ion beam having the decelerated energy is accelerated by the first deceleration suppressor 142, and passes through a designated route. The deceleration of the energy of the ion beam by the first deceleration unit is achieved by adjusting a voltage applied to the first deceleration electrode 141.

The second deceleration unit includes a second deceleration electrode 151, a second analyzer 160, and a second deceleration suppressor 152. The second deceleration electrode 151 secondarily (further) decelerates the energy of the ion beam supplied from the first deceleration suppressor 142. Here, voltages having different levels are applied to the second deceleration electrode 151 so as to decelerate the energy of the ion beams into a first energy and a second energy. Ions from the obtained ion beams having different energies are implanted into different regions of the wafer 200. For example, when a first region of the wafer 200 is exposed so that the ion beam is implanted into the first region, the second deceleration unit decelerates the energy of the supplied ion beam to the first energy. On the other hand, when a second region of the wafer 200 is exposed so that the ion beam is implanted into the second region, the second deceleration unit decelerates the energy of the supplied ion beam to the second energy. Then, the ion beam having the first energy is implanted into the first region of the wafer 200, and the ion beam having the second energy is implanted into the second region of the wafer 200. That is, the ion beams having different energies are respectively implanted into the first and second regions of the wafer 200. The ion beam decelerated to the first or second energy by the second deceleration electrode 151 enters a second analyzer 160, which selectively moves a necessary portion of the ion beam entering the analyzer 160 to a desired (or designated) route. The ion beam passed through the second analyzer 160 is accelerated by the second deceleration suppressor 152, and is supplied to the wafer 200.

The end station includes a wafer supporter 170 for supporting the wafer 200. The wafer supporter 170, as shown by an arrow 180 in FIG. 1, is movable in a direction substantially perpendicular to the implanted ion beam. The wafer 200 also moves together with the movement of the wafer supporter 170. This movement of the wafer 200 is controlled such that the ion beam having the first energy is implanted into the first region of the wafer 200, and the ion beam having the second energy is implanted into the second region of the wafer 200. Although FIG. 1 illustrates that the wafer supporter 170 moves only in the direction substantially perpendicular to the ion beam, the wafer supporter 170 may be rotated or tilted so as to vary the angle between the implanted ion beam and the surface of the wafer 200, if necessary. If any, the movement of the wafer supporter 170 is controlled such that ions from the ion beams having the first and second energies are respectively implanted into the different regions of the wafer 200.

Figure 2:
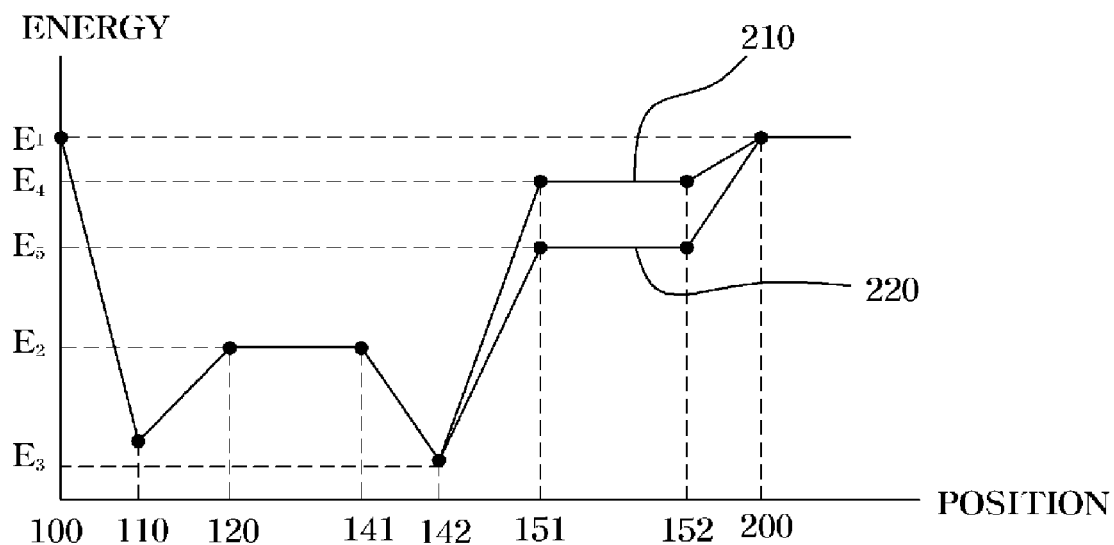
FIG. 2 is a graph illustrating an energy variation of an ion beam according to the position of the ion beam in the apparatus of FIG. 1.
Figure 3:
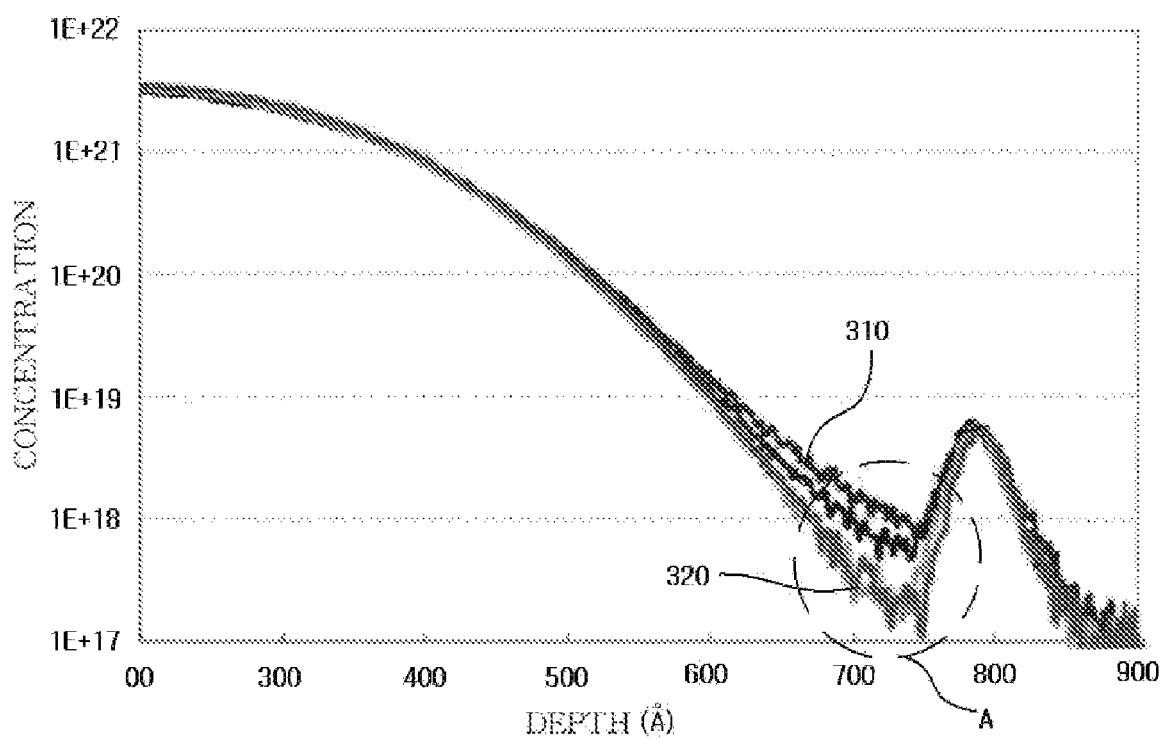
FIG. 3 is a graph illustrating the implantation concentration of the ion beam having the energy variation of FIG. 2.

FIG. 2 is a graph illustrating an energy variation of an ion beam according to the position of the ion beam in the apparatus for partial ion implantation of FIG. 1. FIG. 3 is a graph illustrating the implantation concentration of the ion beam having the energy variation of FIG. 2. In FIG. 2, a horizontal axis represents the position of the ion beam, and a vertical axis represents the energy of the ion beam. Particularly, reference numerals of the horizontal axis represent constituent elements of the apparatus for partial ion implantation shown in FIG. 1.

With reference to FIG. 2, the energy of the ion beam, which is set to have an initial energy (E1), is converted into a relatively low energy (E2), when the ion beam reaches the first deceleration electrode 141. Thereafter, the energy of the ion beam is firstly (initially) decelerated to a lower energy (E3) by the first deceleration electrode 141, until the ion beam reaches the first deceleration suppressor 142. Thereafter, the energy of the ion beam is increased by the first deceleration suppressor 142. Here, the energy of the ion beam is increased to a relatively high energy (E4) or a relatively low energy (E5) according to voltage applied to the second deceleration electrode 151. When the voltage applied to the second deceleration electrode 151 is relatively low, as represented by reference numeral "210", the energy of the ion beam is less decelerated and, thus, becomes (or reaches) the relatively high energy (E4). When the voltage applied to the second deceleration electrode 151 is relatively high, as represented by reference numeral "220", the energy of the ion beam is more decelerated and, thus, becomes (or reaches) the relatively low energy (E5).

As described above, the first deceleration electrode 141 and the second deceleration electrode 151 generate energy distortion, thus generating energy contamination in which a depth for representing the highest ion concentration, i.e., a projection range (Rp), is uniformly maintained and the ion concentration at a lower end, i.e., a tail portion, is varied. That is, with reference to FIG. 3, when a relatively low voltage is applied to the second deceleration electrode 151 and, thus, the energy of the ion beam is decelerated to the relatively high energy (E4), as represented by reference numeral "310", the ion concentration at the tail portion, as represented by "A", is relatively high. On the other hand, when a relatively high voltage is applied to the second deceleration electrode 151 and, thus, the energy of the ion beam is decelerated to the relatively low energy (E5), as represented by reference numeral "320", the ion concentration at the tail portion is relatively low. Accordingly, in the case that the ion beam decelerated to the relatively high energy (E4) by the second deceleration electrode 151 is implanted into the first region of the wafer and the ion beam decelerated to the relatively low energy (E5) by the second deceleration electrode 151 is implanted into the second region of the wafer, the Rp in the second region is the same as the Rp in the first region; but, the ion concentration at the tail portion in the second region is higher than the ion concentration at the tail portion in the first region.

Figure 4:
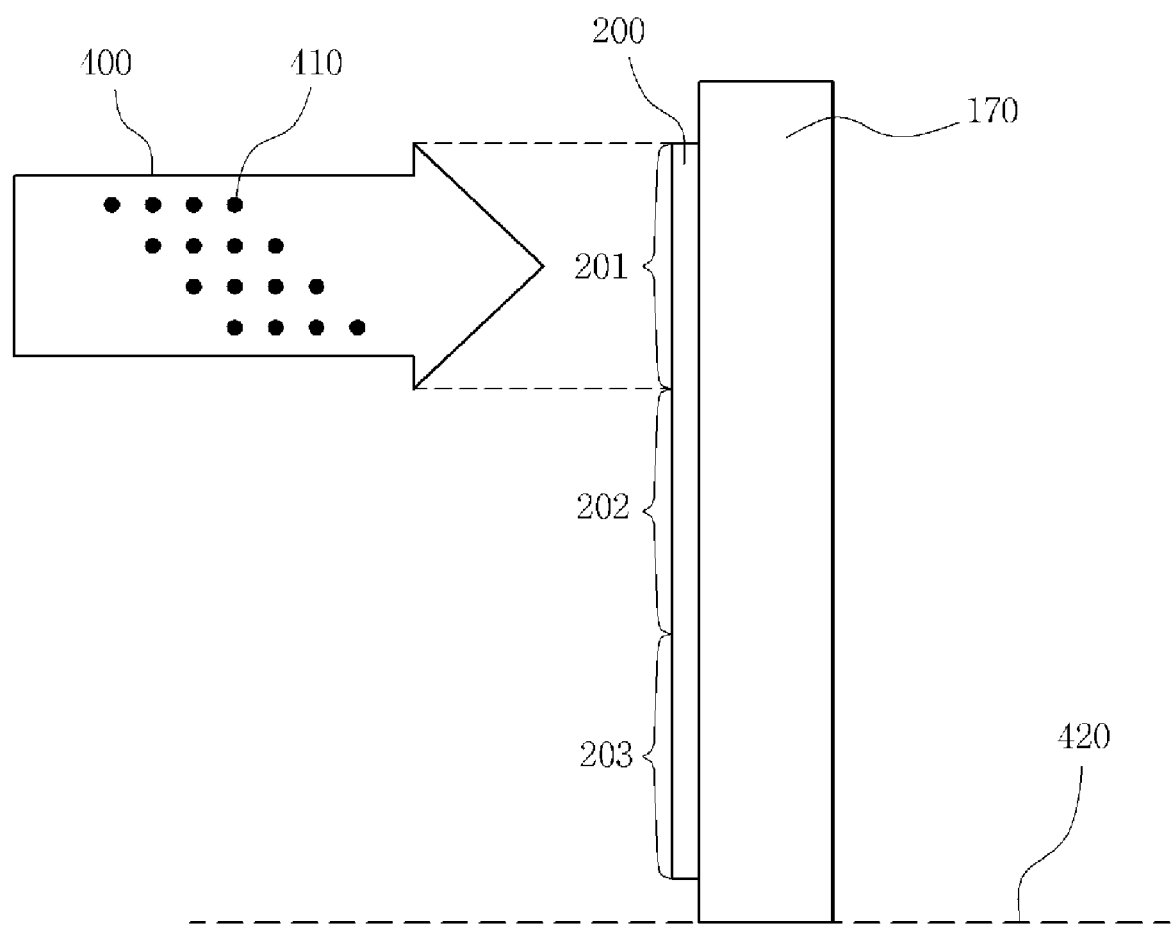
FIGS. 4 to 6 are views illustrating an embodiment of a method for partial ion implantation using the apparatus of FIG. 1.
Figure 5:
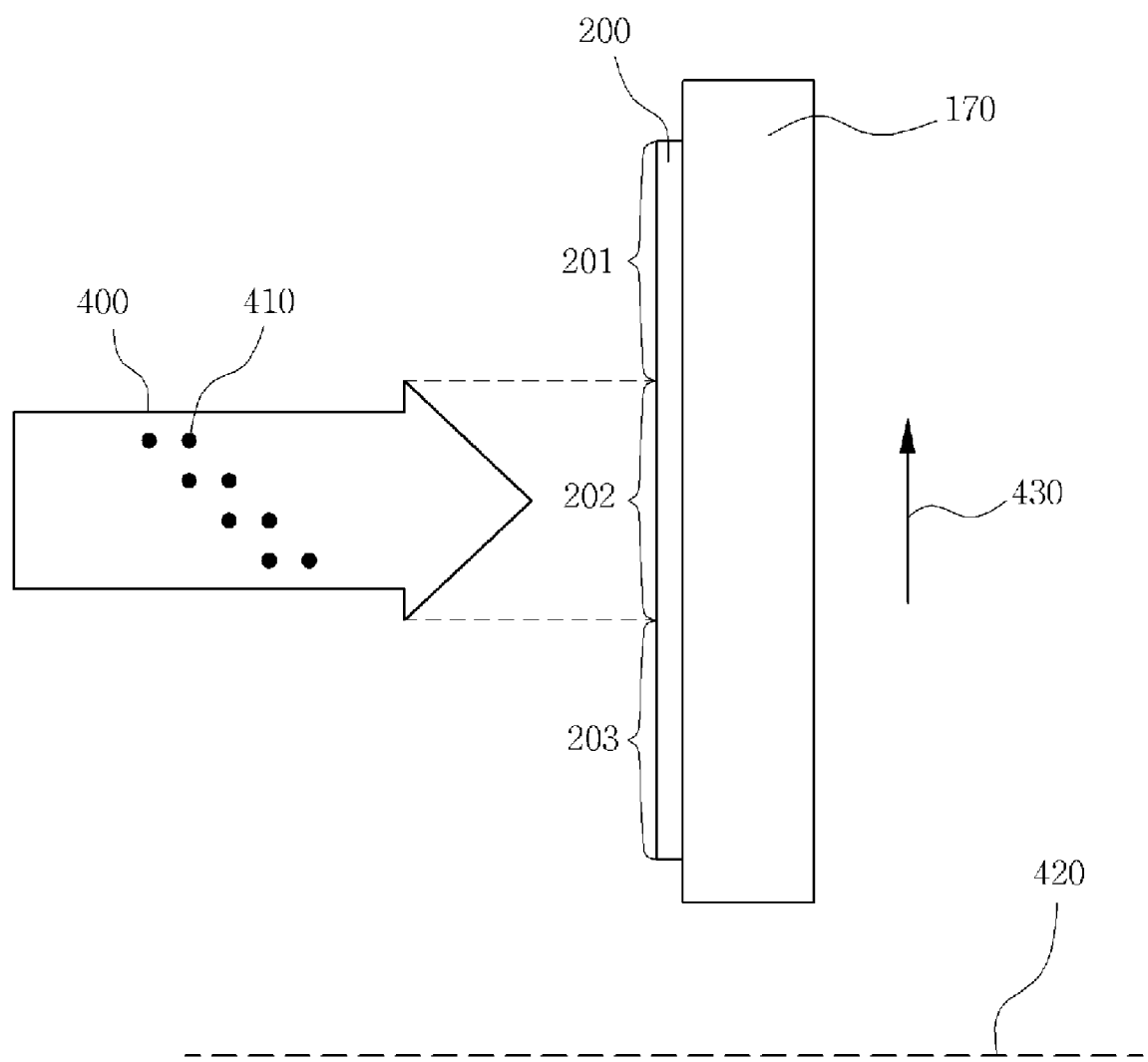
Figure 6:
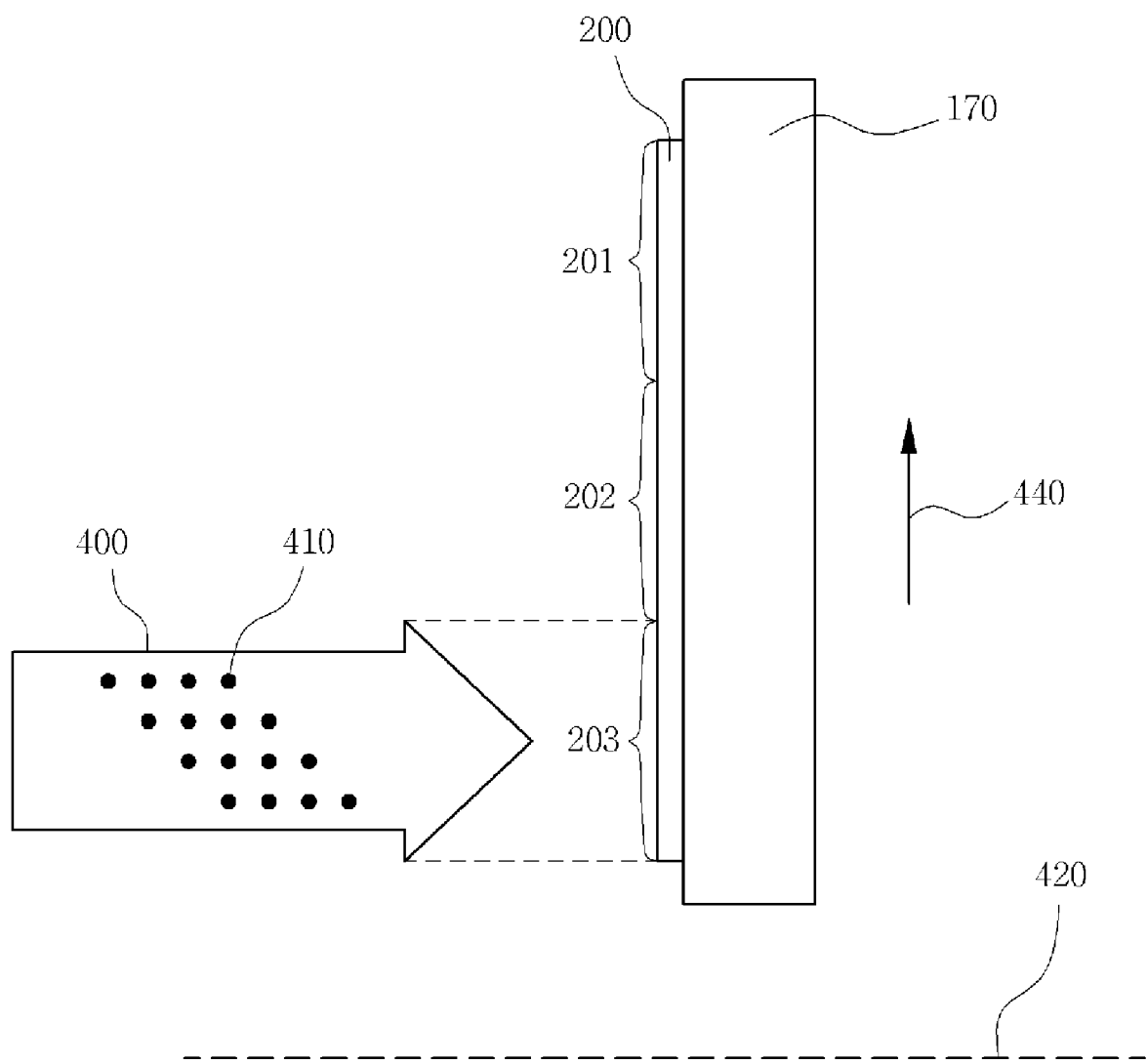

FIGS. 4 to 6 illustrate a method for partial ion implantation using the apparatus shown in FIG. 1. With reference to FIG. 4, the wafer supporter 170 for supporting wafer 200 is disposed such that the lower end of the wafer supporter 170 is located on a reference line 420. Based on that disposition, only a portion of the entire surface of the wafer 200, particularly, an upper first region 201, is exposed to an ion beam 400. Thus, the ion beam 400 is implanted only into the upper first region 201. The ion beam 400 includes a plurality of ion particles 410. Here, the ion beam generated from the ion beam generator, is firstly (initially) decelerated by the first deceleration unit, and is thereafter secondarily (further) decelerated by the second deceleration unit. That is, the energy of the ion beam is distorted by the first and second deceleration units. These distortions are also referred to herein as "energy contamination." Particularly, a relatively high voltage is applied to the second deceleration electrode 151 of the second deceleration unit and, thus, the energy of the ion beam is decelerated to the relatively low energy (E5 of FIG. 2), thereby increasing the implanted ion concentration while maintaining the same Rp.

Next, with reference to FIG. 5, the wafer supporter 170 moves in the direction perpendicular to the implanted ion beam 400, as shown by an arrow 430, such that the lower end of the wafer supporter 170 is separated from the reference line 420 by a designated interval. Then, only a central second region 202 of the wafer 200 is exposed to the ion beam 400. Thus, the ion beam 400 is implanted only into the central second region 202. Here, the energy contamination of the ion beam occurs through the first deceleration by the first deceleration unit and the second deceleration by the second deceleration unit. Particularly, a relatively low voltage is applied to the second deceleration electrode 151 of the second deceleration unit and, thus, the energy of the ion beam is decelerated to the relatively high energy (E4 of FIG. 2), thereby decreasing the implanted ion concentration while maintaining the same Rp.

Next, with reference to FIG. 6, the wafer supporter 170 moves in the direction perpendicular to the implanted ion beam 400, as shown by an arrow 440, such that the lower end of the wafer supporter 170 is separated more distantly from the reference line 420. Then, only a lower third region 203 of the wafer 200 is exposed to the ion beam 400. Thus, the ion beam 400 is implanted only into the lower third region 203. Here, the energy contamination of the ion beam occurs through the first deceleration by the first deceleration unit and the second deceleration by the second deceleration unit. Particularly, in the same manner as the ion implantation into the first region 201 of the wafer 200 (with reference to FIG. 4), a relatively high voltage is applied to the second deceleration electrode 151 of the second deceleration unit and, thus, the energy of the ion beam is decelerated to the relatively low energy (E5 of FIG. 2), thereby increasing the implanted ion concentration while maintaining the same Rp.

Figure 7:
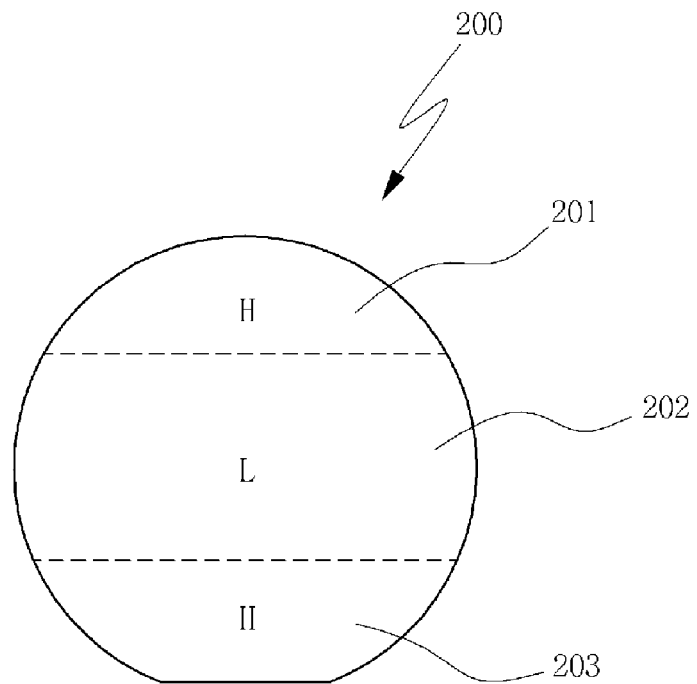
FIG. 7 illustrates a distribution of the implantation concentration of ions implanted into a wafer by the method for partial ion implantation of FIGS. 4 to 6; and, FIG. 8 illustrates another distribution of the implantation concentration of ions implanted into a wafer by the method for partial ion implantation.

FIG. 7 illustrates a distribution of the implantation concentration of ions implanted into a wafer by the method for partial ion implantation of FIGS. 4 to 6. With reference to FIG. 7, the tail portion in an upper first region 201 of the wafer 200 has a relatively high ion concentration (H), and the tail portion in a central second region 202 of the wafer 200 has a relatively low ion concentration (L). Further, the tail portion in a lower third region 203 of the wafer 200 has a relatively high ion concentration (H), identically with the upper first region 201 of the wafer 200. As stated above, all regions of the wafer 200 have the same Rp.

Figure 8:
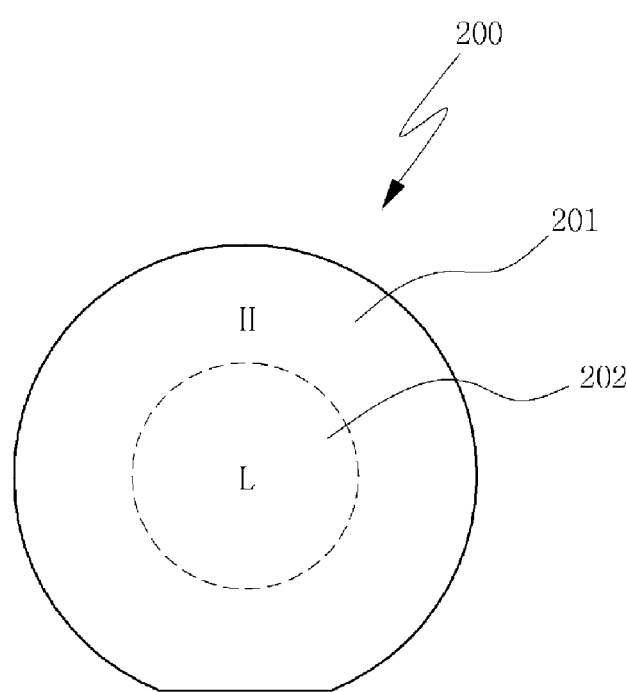

FIG. 8 illustrates another distribution of the implantation concentration of ions implanted into a wafer by the method for partial ion. With reference to FIG. 8, when the ion implantation into the wafer is performed, the wafer 200 is rotated during the process, as shown in FIGS. 4 to 6. In this case, the tail portion in an edge region of the wafer 200, i.e., a first region 201, has a relatively high ion concentration (H), and the tail portion in a core region of the wafer 200, i.e., a second region 202, has a relatively low ion concentration (L).

As apparent from the above description, an apparatus and method for partial ion implantation are provided, in which ion beams having different energies are respectively implanted into regions of a wafer, thereby adjusting the distribution of a dopant through energy rather than a dopant dose. The disclosed method and apparatus desirably provide the ability to control electrical parameters in the wafer. Particularly, the tail portions in the regions of the wafer have different ion concentrations while maintaining the same Rp, thus more finely controlling the electrical parameters, for example, threshold voltage, punch through characteristics, sheet resistance characteristics, etc.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for implanting ions into a wafer, the apparatus comprising:
   an ion beam generator;
   a first deceleration unit capable of and positioned to initially decelerate the energy of an ion beam generated by the ion beam generator; and,
   a second deceleration unit capable of and positioned to secondarily decelerate the energy of the ion beam, after said initial deceleration, into first and second energy levels according to ion-implantable regions of the wafer.

2. The apparatus of claim 1, wherein the second deceleration unit comprises at least one deceleration electrode.

3. The apparatus of claim 1 further comprising:
   a wafer support adjustable to position a first region of the wafer to receive and have implanted therein the ion beam having the first energy level, when present, and adjustable to position a second region of the wafer to receive and have implanted therein the ion beam having the second energy level, when present.

4. The apparatus of claim 3, wherein the wafer support is adjustable to position the wafer in a direction that is substantially perpendicular to the implanted ion beams.

5. The apparatus of claim 3, wherein the wafer support is rotatatable.

6. The apparatus of claim 3, wherein the wafer support is variably tiltable.

7. The apparatus of claim 1, wherein the first deceleration unit further comprises a first deceleration suppressor capable of and positioned to accelerate the initially-decelerated ion beam.

8. A partial ion implantation method comprising:
   providing a wafer having first and second ion-implantable regions;
   generating an ion beam;
   decelerating the generated ion beam in a first deceleration step;
   in a second deceleration step, decelerating the energy level of the ion beam into a first or second energy level according to regions of the wafer; and,
   implanting ions from the ion beam having the first energy level, when present, into the first wafer region, and implanting ions from the ion beam having the second energy level, when present, into the second wafer region.

9. The method of claim 8 further comprising:
   moving the wafer such that ions from the ion beam having the first energy level, when present, are implanted into the first wafer region, and ions from the ion beam having the second energy level, when present, are implanted into the second wafer region.

10. The method of claim 8 further comprising accelerating the energy of the ion beam after the first deceleration step and prior to the second deceleration step.

* * * * *